United States Patent [19]

Jones et al.

[11] Patent Number: 4,536,882

[45] Date of Patent: Aug. 20, 1985

[54] EMBEDDED ABSORBER X-RAY MASK AND METHOD FOR MAKING SAME

[75] Inventors: Addison B. Jones, Yorba Linda; Siegfried G. Plonski, Santa Ana, both of Calif.

[73] Assignee: Rockwell International Corporation, El Segundo, Calif.

[21] Appl. No.: 119,331

[22] Filed: Feb. 7, 1980

Related U.S. Application Data

[62] Division of Ser. No. 3,062, Jan. 12, 1979, abandoned.

[51] Int. Cl.³ .................. G21C 11/00; G02B 5/00; G03F 11/00; B05B 5/00
[52] U.S. Cl. .................................. 378/35; 427/160; 427/258; 427/264; 427/270; 250/505.1; 250/515.1; 430/5

[58] Field of Search .............. 427/160, 258, 264, 270; 430/5; 378/35; 250/515.1, 505.1

[56] References Cited

U.S. PATENT DOCUMENTS 3,742,230  6/1973  Spears et al. ................... 430/5
3,892,973  7/1975  Coquin et al. .................. 378/35
4,037,111  7/1977  Coquin et al. .................. 378/35

Primary Examiner—Richard L. Schilling
Attorney, Agent, or Firm—H. Fredrick Hamann; Daniel R. McGlynn

[57] ABSTRACT

A mask which is especially useful in X-ray lithography wherein the X-ray absorber material is embedded in the mask membrane.

9 Claims, 6 Drawing Figures

U.S. Patent     Aug. 20, 1985     4,536,882
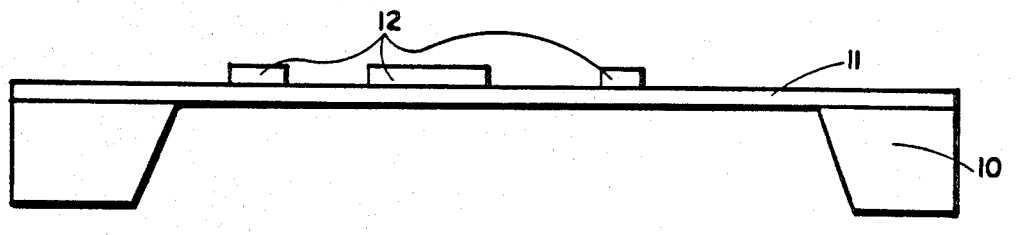
PRIOR ART FIG. 1
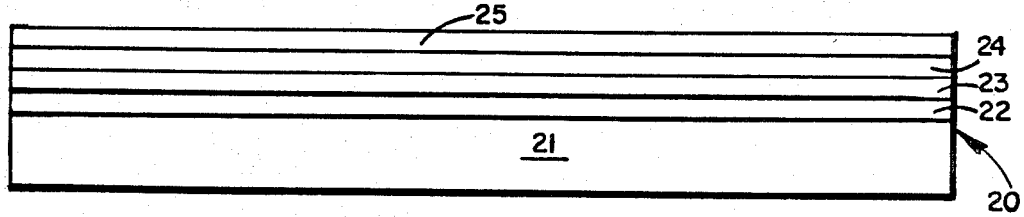
FIG. 2A
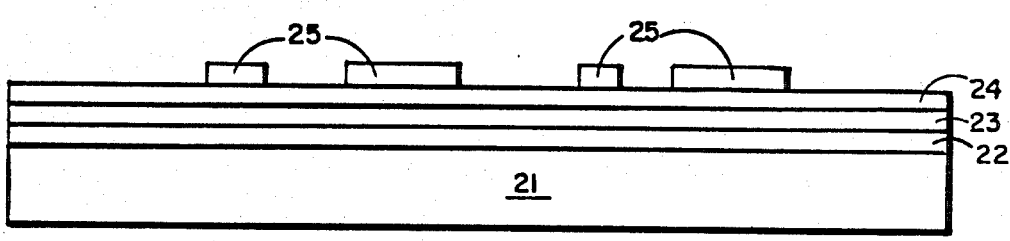
FIG. 2B
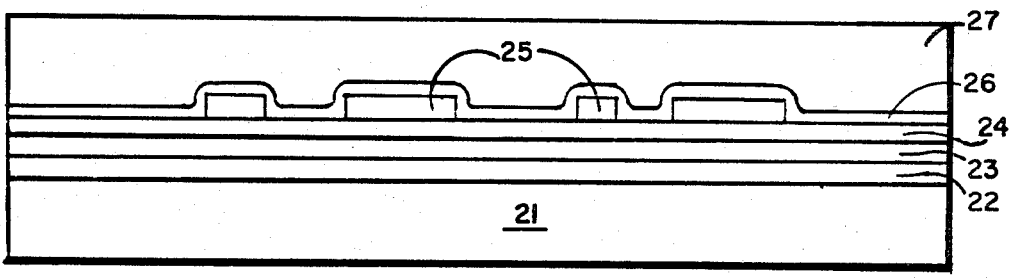
FIG. 2C
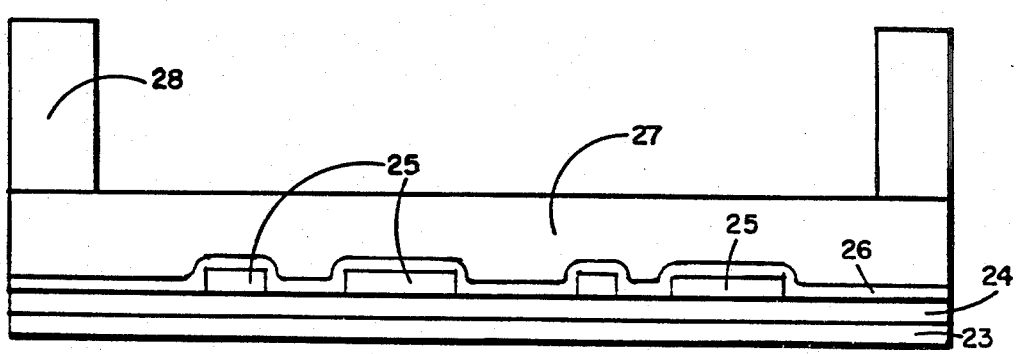
FIG. 2D
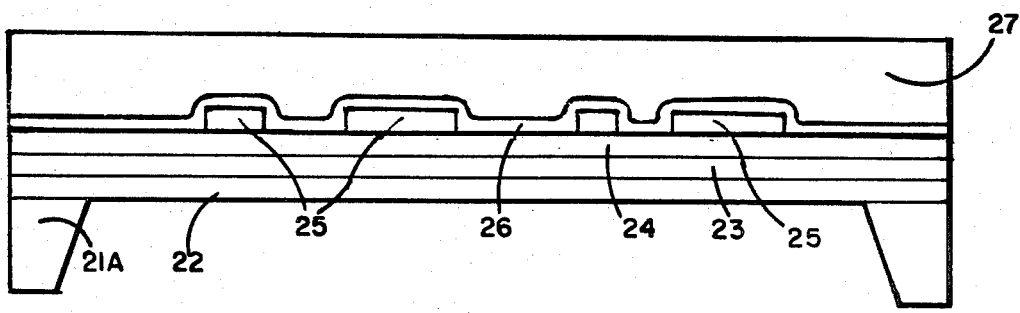
FIG. 2E

EMBEDDED ABSORBER X-RAY MASK AND METHOD FOR MAKING SAME

This is a division of application Ser. No. 3,062 filed Jan. 12, 1979, now abandoned.

BACKGROUND OF THE INVENTION

1. Field of the Invention

This invention is directed to X-ray lithography masks, in general, and to a mask having the X-ray absorber material embedded in the mask, per se.

2. Prior Art

There are many known masks which have been produced for use with X-ray lithography techniques. The known masks generally comprise a thin supporting membrane which is transparent to X-rays, a patterned absorber layer of dense material which is substantially opaque to soft X-rays supported on the membrane, and mechanical support means such as a peripheral ring bonded to the membrane.

The known masks noted above are typically fabricated in a sequence wherein a membrane is bonded to a support ring, the membrane is coated with an absorber layer (for example heavy metal), and the absorber is patterned using suitable lithography and/or etching steps.

However, the known masks and methods of making same are not totally satisfactory. That is, in the known masks the patterned absorber typically protrudes above the membrane surface leading to problems with mechanical damage and/or wear as well as significant problems with adhesion of contamination and particulate matter. More importantly, however, the known masks and method require that the absorber material be deposited in such a manner that, when patterned, non uniform strain in the thin membrane occurs.

PRIOR ART

1. E. Bassous, R. Feder, E. Spiller, and J. Topalian, *Solid State Technology*, September 1976, p. 55.
2. Suzuki et al., *Japan J. Appl. Phys.*, 17, 1978, p. 1,447.
3. P. L. Spears, H. I. Smith, and R. Stern, U.S. Pat. No. 3,742,230, June 28, 1973.
4. Coquin et al., U.S. Pat. No. 3,892,973.

SUMMARY OF THE INVENTION

This invention is directed to a mask and method of making same. The mask is, typically, useful in the X-ray lithography, or charged particle lithography fields. The mask uses a temporary substrate as a template and support for the mask membrane, an X-ray absorber layer and a supporting membrane layer. A separate support structure can be provided for the mask. In addition, an adhesion promoting layer may be optionally utilized between the absorber layer and the membrane layer, and a capping layer provided to completely seal the absorber pattern, either an etch stop layer or a parting agent layer can be disposed between the substrate and the absorber layer or capping layer depending upon the ultimate structural arrangement of the mask as may be defined by the optional support structure.

BRIEF DESCRIPTION OF THE DRAWINGS

FIG. 1 is a cross-sectional view of an X-ray lithography mask known in the art.

FIGS. 2a through 2e are cross-sectional views of an embedded absorber mask at various stages of the fabrication technique utilized to form the mask.

DESCRIPTION OF A PREFERRED EMBODIMENT

Referring now to FIG. 1, there is shown a cross-sectional view of an X-ray lithography mask known in the art. In FIG. 1, a suitable support ring 10 such as quartz or other suitable material is provided. A thin supporting membrane 11 is stretched cross support structure 10 and bonded thereto in a suitable manner. Membrane 11 may be formed of any suitable material substantially transparent to X-rays such as thin metals, covalently bonded materials, polymers or the like. Patterned absorber layer 12 is disposed on the surface of supporting membrane 11. Pattern 12, which is substantially opaque to soft X-rays, may be achieved by initially placing the layer of opaque material on membrane 11 and then patterning this material using a lithography step or an etching step.

As noted above, it is clear that the prior art mask includes a patterned absorber layer 12 which protrudes above the surface of membrane 11 therein subjecting the absorber layer to both excessive wear and the possibility of trapping contaminants therebetween wherein the mask becomes less useful and less accurate. Moreover, by producing the mask in the standard manner, membrane 11 is usually subjected to non-uniform stresses as a result of the operation of the lithographic and/or etching step which patterns the absorber layer to form elements 12.

Referring now to FIGS. 2a through 2e, there is shown and described a method of forming a mask and the mask produced by the method. In FIG. 2a there is shown composite 20 which includes a polished planar substrate 21 which serves to act as a temporary support for a mask membrane during fabrication. Typically, substrate 21 may be formed of polished glass, silicon or any other suitable material to serve as a substrate as will become evident hereinafter. In the embodiment shown in FIG. 2a, layer 22 is formed on the planar surface of substrate 21. Layer 22 can be either a parting compound or an etch stop as will appear hereinafter. Typically the parting compound may be a sugar film or a suitable highly soluble salt such as NaCl, CsI, $BaCl_2$, or the like. Alternatively, the parting compound may be a soap or detergent film or soluble organic film as is known in the art. Conversely, if layer 22 is an etch stop layer, a substance which is not soluble in the etchant to be used on the substrate 21 may be used. The material of the etch stop layer and the substrate as well as the etchant will be mutually defined. The etch stop layer 22 should be substantially pinhole-free to prevent etching of capping layer 23, adhesion layer 24 or 26, or absorber layer 25, as noted hereinafter.

Absorber layer 25 is a layer which is utilized to absorb the X-rays and to form a pattern. Layer 25 is typically 0.2–1.0 $\mu$m thick and formed of a heavy metal such as gold, tungsten, platinum or the like which is substantially opaque to X-ray radiation. Typically, layer 25 may be deposited by suitable vacuum depositon or other plating process either directly on the substrate 21, on etch step or parting layer 22, on capping layer 23, on an adhesion layer 24 which may be desirable to promote adhesion of the absorber pattern. Use of layers 22, 23, and 24 is optional—one layer may perform the function of two or more. Alternatively one or more of these intermediate layers may be omitted.

Referring now to FIG. 2b, absorber layer 25 is shown as having been patterned. Patterning of layer 25 is typically performed by a lithography step and by a wet or dry etching step as is known in the art. Conversely, the patterning layer could be produced by plating through a lithography mask or by a lift-off method or any combination of the above. These steps are typically known in the art. Moreover as noted above, each of these steps tends to produce strained distortions in the supporting substrate 21. In composite shown in FIG. 2b, the stress variations produced by the patterning of layer 25 produce strain distributed through substrate 21 which is, typically, over 100 times as thick as the X-ray mask membrane such as membrane 11 in FIG. 1. Consequently, little or no strain is produced and patterning is maintained in a high fidelity and resolution.

Referring to FIG. 2c, the supporting membrane 27 is deposited. Membrane 27 can be deposited by means of spinning a polymide film or the like onto the patterned surface of the composite. Of course, other techniques such as vacuum evaporation, plasma deposition, low vacuum condensation and the like can be utilized. Suitable materials for substrate 27 have high transparency or transmissivity for soft X-rays and can be formed of materials such as Be, $B_4C$, organic polymers or the like.

Incidentally, in some cases it may be desirable to include thin layer 26 of a material to promote adhesion between the absorber 25 and the membrane. The adhesion promoting layer 26 can be of any suitable material such as titanium and can be applied in any typical fashion known in the art. It should be noted that membrane 27 is provided only subsequent to the patterning of layer 25 wherein no non-uniform stresses or strains are applied to this membrane.

Referring now to FIG. 2d, there is shown one alternative of the final mask structure. In FIG. 2d, a separate supporting peripheral ring 28 is provided and is bonded to membrane 27 in any suitable fashion. After support ring 28 is in place, supporting substrate 21 may be etched away in a suitable fashion. Alternatively, in the event that the layer 22 was formed of a parting compound, layer 22 may be dissolved in a suitable manner wherein the mask comes free from the supporting substrate 21 thereby leaving a mask with a planar surface and X-ray absorbing pattern embedded therein.

Referring to FIG. 2e, there is shown an alternative mask structure wherein a portion of support substrate 21 is etched away thereby leaving a peripheral support ring 21A. In this structure, layer 22 is an etch stop layer which controls etching through support substrate 21a to prevent etching of membrane 25. Thus, the various relationships between membrane 27, support substrate 21, etch stop layer 22 and the etchant are determined as noted above.

At the time of separation of the mask from support substrate 21, the stress of the patterned absorber 25 is freed to distort the thin mask membrane which now consists of a composite of layers 23, 24, 26, and 27. If, however, care is taken to deposit a stress-free absorber layer 25, or to match the tension of the absorber 25 and the membrane film 27, the resultant mask will exhibit uniform tension and be free of pattern related strains. Also, non-planar layers can be added to both sides of the mask membrane composite to adjust the composite membrane tension.

FIGS. 2d and 2e show a totally encapsulated mask structure, wherein frequently the capping layer 23 and membrane 27 are of the same material. It has already been indicated that many of the layers used might be eliminated by using a single layer with several functions (e.g. a "capping layer" that also functions as an etch stop). In fact, useful "partially embedded" masks can be made *without* layers 22, 23, 24, or 26. For example, in FIG. 2b, metal absorber pattern 25 can be disposed directly on a suitable substrate 21 such as glass, silicon or the like. In FIG. 2c, the pattern 25 is coated directly with a suitable membrane material 27. After removal of the substrate 21 by an etchant which does not attack absorber pattern 25 or mask membrane 27, the finished "partially embedded" mask similar to the devices seen in FIGS. 2d or 2e is produced (without layers 23, 24 and 26). In FIG. 2d, support frame 28 is attached to membrane 27 and the substrate 21 completely removed. In FIG. 2e, a portion of substrate 21a is retained for mechanical support.

Thus, there has been shown and described a method of forming an X-ray mask wherein a patterned X-ray absorber layer is embedded in the mask substrate. No stress or strain are imposed upon the mask supporting membrane during the patterning process related to the absorber layer. The planar mask layer provides both mechanical and contamination free advantages. Moreover, the technique described herein produces masks which are relatively distortionless as a result of the patterning process of the X-ray absorber layer. The distortionless mask permits high resolution of microcircuits and the ready replication thereof. While certain specific materials have been recited in the description, other materials can be utilized in a satisfactory manner. The description is intended to define the best mode of the invention known to date and is not intended to limit the scope of the invention. The scope of this invention is limited by the claims appended hereto.

Having thus described the preferred embodiment, what is claimed is:

1. A method of making an X-ray mask for X-ray lithography comprising the steps of:
   providing a substrate for supporting the mask membrane of the X-ray mask during fabrication thereof;
   depositing a thin layer of material which is opaque to X-ray or charged particle radiation on said substrate, said thin layer having a thickness less than that of said substrate;
   patterning said thin layer to form a mask pattern;
   applying a mask membrane layer of a high X-ray transmissive material over said patterned thin layer; and
   removing at least a portion of the substrate to form an X-ray mask.

2. A method as defined in claim 1, further comprising the step of depositing an etch stop layer or a parting layer between said substrate and said thin layer to facilitate the removal of said substrate.

3. A method as defined in claim 2, further comprising the step of depositing a capping layer between said substrate and said etch stop layer or parting layer.

4. A method as defined in claim 1, further comprising the step of depositing an adhesion layer above and below said thin layer to promote adhesion of said thin layer to the adjacent layers.

5. A method as defined in claim 1, wherein said step of removing a portion of said substrate results in the retention of a portion of said substrate on peripheral sides of the X-ray mask.

6. A method as defined in claim 1, wherein said step of removing at least a portion of said substrate results in the removal of the entire substrate.

7. A method as defined in claim 6, further comprising the step of bonding a rigid support to said membrane layer, and wherein said step of removing a portion of said substrate is performed subsequently to the step of bonding of said rigid support.

8. A method as defined in claim 1, wherein said deposition of said thin layer is performed by vacuum deposition.

9. A method as defined in claim 1, wherein said step of applying a mask membrane layer comprises spinning a polimide film on said patterned layer.

* * * * *